(12) United States Patent
Kimman et al.

(10) Patent No.: US 11,837,931 B2
(45) Date of Patent: Dec. 5, 2023

(54) MULTIPHASE LINEAR MOTOR, MULTIPHASE PLANAR MOTOR, STAGE, LITHOGRAPHIC APPARATUS AND DEVICE MANUFACTURING METHOD

(71) Applicant: ASML Netherlands B.V., Veldhoven (NL)

(72) Inventors: Maarten Hartger Kimman, Veldhoven (NL); Dave Braaksma, Veldhoven (NL); Peter Michel Silvester Maria Heijmans, Weert (NL); Christiaan Alexander Hoogendam, Westerhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 17/690,203

(22) Filed: Mar. 9, 2022

(65) Prior Publication Data
US 2022/0200385 A1 Jun. 23, 2022

Related U.S. Application Data

(62) Division of application No. 16/073,258, filed as application No. PCT/EP2017/050199 on Jan. 5, 2017, now Pat. No. 11,303,175.

(30) Foreign Application Priority Data

Feb. 12, 2016 (EP) .................................... 16155377
Apr. 28, 2016 (EP) .................................... 16167411

(51) Int. Cl.
*H02K 3/28* (2006.01)
*H02K 41/03* (2006.01)
(Continued)

(52) U.S. Cl.
CPC ........... *H02K 3/28* (2013.01); *G03F 7/70758* (2013.01); *H02K 41/031* (2013.01); *H02K 7/09* (2013.01);
(Continued)

(58) Field of Classification Search
CPC ........ H02K 3/28; H02K 29/03; H02K 41/031; H02K 2201/18; H02K 2213/03
See application file for complete search history.

(56) References Cited

U.S. PATENT DOCUMENTS 6,147,421 A   11/2000 Takita et al.
6,208,045 B1   3/2001 Hazelton et al.
(Continued)

FOREIGN PATENT DOCUMENTS

CN   2894058 Y   4/2007
CN   101552523 A   10/2009
(Continued)

OTHER PUBLICATIONS

Herve Le Chenadec, European International Searching Authority, International Search Report, counterpart PCT Application No. PCT/EP2017/050199, dated Jun. 14, 2017, 6 pages total.
(Continued)

*Primary Examiner* — Ramon M Barrera
(74) *Attorney, Agent, or Firm* — DiBerardino McGovern IP Group LLC

(57) ABSTRACT

An electromagnetic motor is described, the electromagnetic motor comprising: a magnet assembly configured to generate a two-dimensional alternating magnetic field having a pitch Pm1 in a first direction and a pitch Pm2 in a second direction; a coil assembly configured to co-operate with the magnet assembly to generate a first force in the first direction and a second force in the second direction, wherein the coil assembly comprises a first coil set comprising a plurality of
(Continued)

first coils for generating the first force and a second coil set comprising a plurality of second coils for generating the second force, wherein a ratio R1 of a coil pitch Pc1 in the first coil set in the first direction over Pm1 is different from a ratio R2 of a coil pitch Pc2 in the second coil set in the second direction over Pm2.

20 Claims, 7 Drawing Sheets

(51) Int. Cl.
    *G03F 7/00*          (2006.01)
    *H02K 29/03*        (2006.01)
    *H02K 7/09*         (2006.01)

(52) U.S. Cl.
    CPC ......... *H02K 29/03* (2013.01); *H02K 2201/18* (2013.01); *H02K 2213/03* (2013.01)

(56) References Cited

U.S. PATENT DOCUMENTS

| | | | |
|---|---|---|---|
| 7,768,158 B2 | 8/2010 | Kitamura et al. | |
| 8,674,561 B2 | 3/2014 | Hoshi | |
| 2005/0173991 A1 | 8/2005 | Watarai et al. | |
| 2010/0084928 A1 | 4/2010 | Yoshida et al. | |
| 2010/0214548 A1 | 8/2010 | Vervoordeldonk et al. | |
| 2010/0238425 A1 | 9/2010 | Binnard | |
| 2011/0299054 A1 | 12/2011 | Van de Rijdt et al. | |
| 2012/0062046 A1 | 3/2012 | Hoshi | |
| 2012/0212723 A1 | 8/2012 | Hol et al. | |
| 2012/0300186 A1 | 11/2012 | Butler et al. | |
| 2013/0258307 A1* | 10/2013 | Mahadeswaraswamy | H02K 41/031 355/72 |
| 2014/0042833 A1 | 2/2014 | Hiura et al. | |
| 2014/0285122 A1 | 9/2014 | Lu et al. | |
| 2014/0368062 A1 | 12/2014 | Loeser et al. | |
| 2015/0130298 A1 | 5/2015 | Nomura et al. | |

FOREIGN PATENT DOCUMENTS

| | | | |
|---|---|---|---|
| CN | 101669269 A | 3/2010 | |
| CN | 101840159 A | 9/2010 | |
| CN | 102269935 A | 12/2011 | |
| CN | 102403871 A | 4/2012 | |
| CN | 102645850 A | 8/2012 | |
| CN | 102792571 A | 11/2012 | |
| CN | 102799072 A | 11/2012 | |
| CN | 103548248 A | 1/2014 | |
| CN | 103891114 A | 6/2014 | |
| CN | 104272568 A | 1/2015 | |
| CN | 104518595 A | 4/2015 | |
| EP | 1292968 A2 | 3/2003 | |
| EP | 1311056 A1 | 5/2003 | |
| JP | S06225861 A | 2/1987 | |
| JP | 2000278931 A | 10/2000 | |
| JP | 2000333437 A | 11/2000 | |
| JP | 2001086726 A | 3/2001 | |
| JP | 2006129546 A | 5/2006 | |
| JP | 2010213546 A | 9/2010 | |
| JP | 4577491 B2 | 11/2010 | |
| JP | 2011217591 A | 10/2011 | |
| JP | 2012060852 A | 3/2012 | |
| JP | 2014531189 A | 11/2014 | |
| TW | 486849 B | 5/2002 | |
| TW | 200846832 A | 12/2008 | |
| WO | 2008147175 A1 | 12/2008 | |
| WO | 2013059934 A1 | 5/2013 | |
| WO | WO-2013112759 A1 * | 8/2013 | ......... G03F 7/70758 |
| WO | 2013164892 A1 | 11/2013 | |
| WO | 2017005457 A1 | 1/2017 | |

OTHER PUBLICATIONS

Herve Le Chenadec, European International Searching Authority, Written Opinion, counterpart PCT Application No. PCT/EP2017/050199, dated Jun. 14, 2017, 10 pages total.

Office Action, counterpart Chinese Patent Application No. 201780010621.X dated Aug. 9, 2019, 15 pages total (including partial English translation of 8 pages).

Office Action, counterpart Japanese Patent Application No. 2018-535106, dated Aug. 26, 2019, 10 pages total (including English translation of 5 pages).

Office Action & Search Report, counterpart Chinese Patent Application No. 201780010621X dated Jun. 8, 2020, 14 pages total (including English translation of 7 pages).

\* cited by examiner

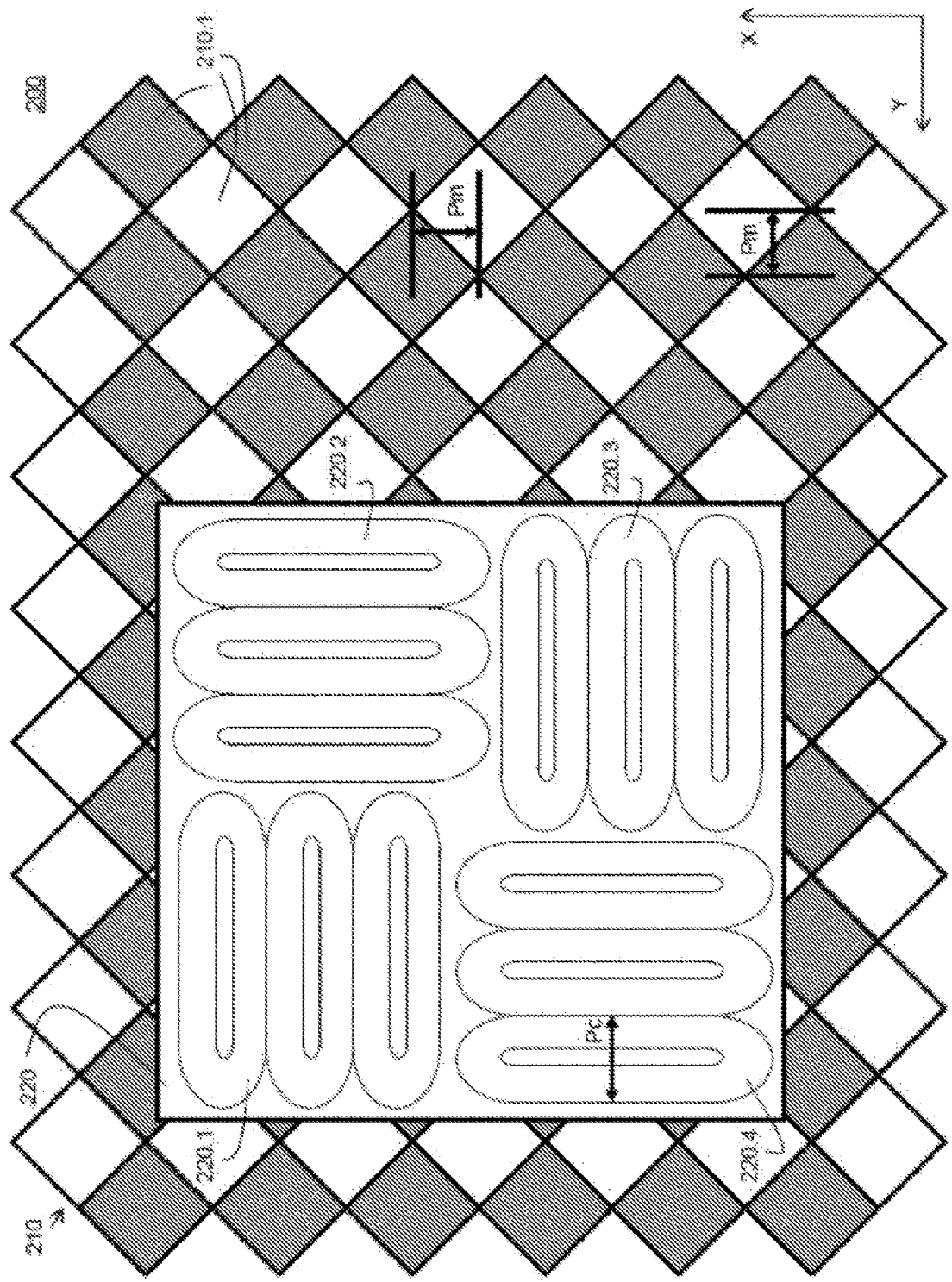

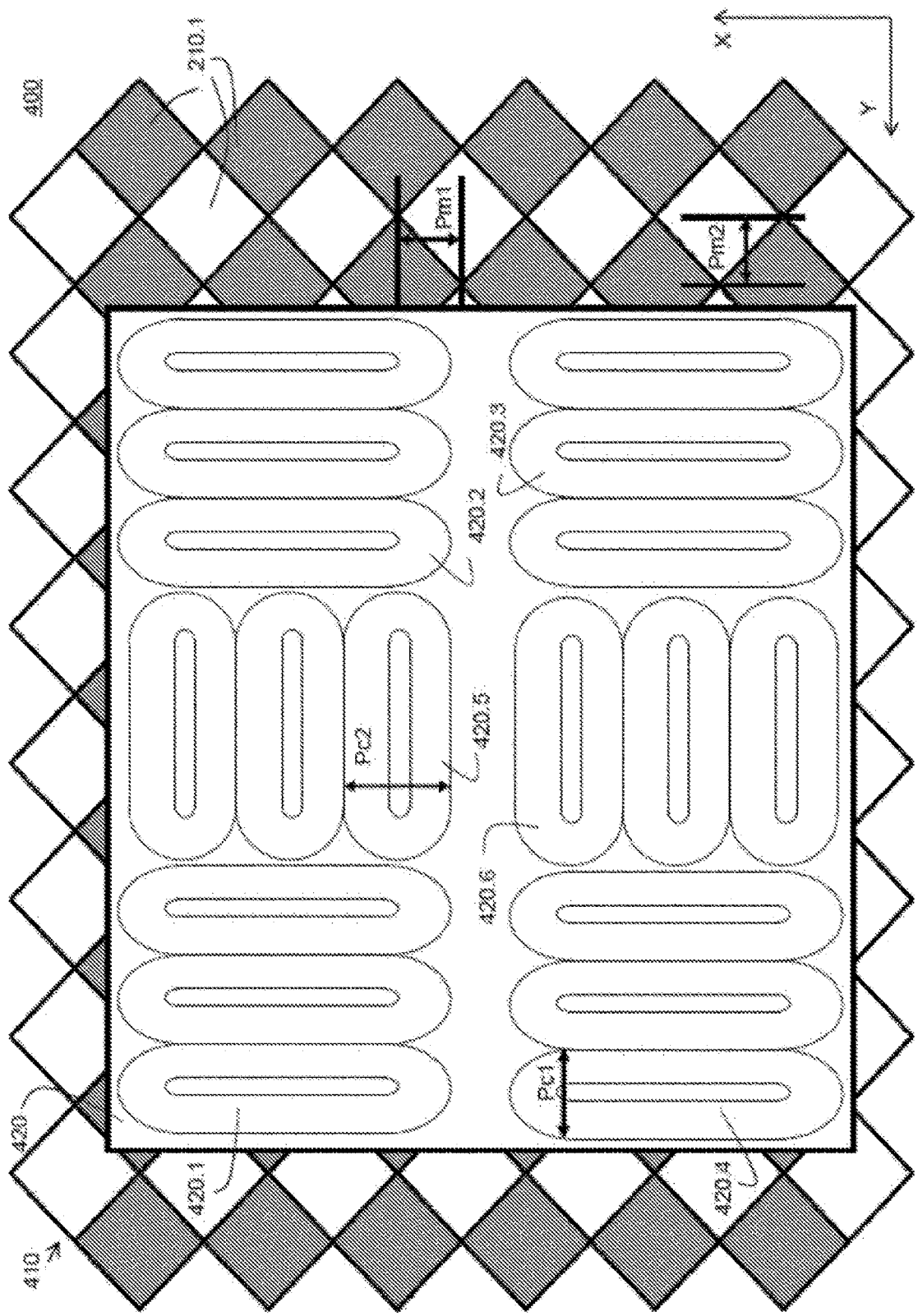

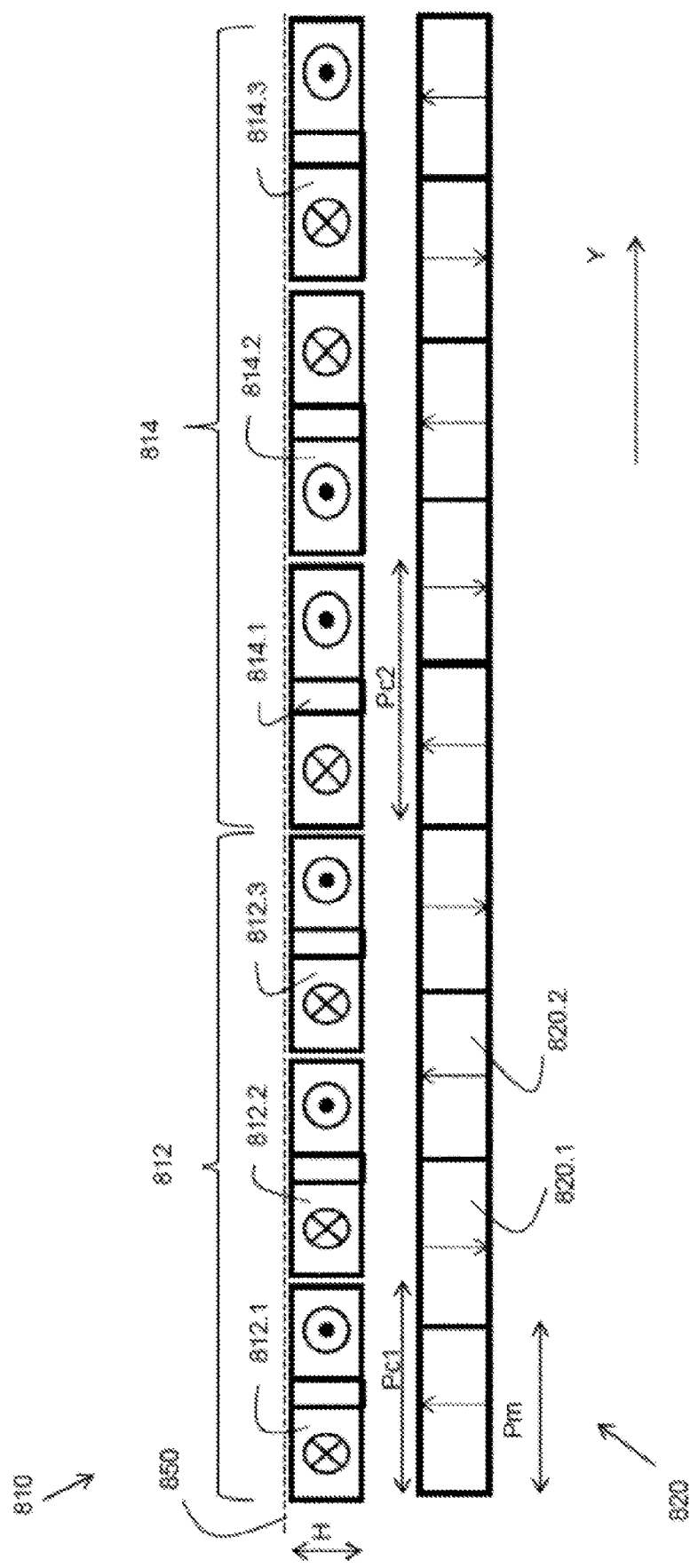

MULTIPHASE LINEAR MOTOR, MULTIPHASE PLANAR MOTOR, STAGE, LITHOGRAPHIC APPARATUS AND DEVICE MANUFACTURING METHOD

CROSS-REFERENCE TO RELATED APPLICATIONS

This application is a divisional of U.S. application Ser. No. 16/073,258, which was filed on 26 Jul. 2018; which is a national phase of International application PCT/EP2017/050199, which was filed on 5 Jan. 2017; which claims priority to EP application 16155377.1, which was filed on 12 Feb. 2016, and to EP application 16167411.4, which was filed on 28 Apr. 2016. Each of these patent applications is incorporated herein by reference in its entirety.

BACKGROUND

Field of the Invention

The present invention relates to an electromagnetic motor, a multiphase linear motor, a multiphase planar motor, a stage, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

In order to synchronously scan the pattern through the radiation beam and the substrate through the patterned image, the patterning device and the substrate are mounted on object tables that are positioned using positioning devices. Typically such positioning devices comprise a combination of electromagnetic actuators and motors. In a typical arrangement, such a positioning device may include a short-stroke module for accurate positioning, over comparatively small distances, of the patterning device or substrate in 6 degrees of freedom, the short stroke module including the patterning device or substrate being movable over comparatively large distances by a long stroke module, e.g. comprising one or more linear or planar motors. In prior art lithographic apparatus, multiphase, e.g. three-phase, linear or planar motors are commonly used with a moving-magnet configuration as a long stroke module. The coils are then connected to the fixed world and the magnets are moveable relative to the coils.

The design of such a long stroke module has to meet a variety of constraints such as force requirements, constraints with respect to available footprint, and constraints with respect to allowable dissipation.

As another example of such constraints to be met, it can be mentioned that the aim for such motors is that for a given current through the coils, the generated force is constant and thus independent of the position of the magnets relative to the coils. However, in practice, a constant force or motor constant is not feasible and a ripple remains. This ripple may be caused by voltage design rules, mechanical design rules, manufacturability and/or serviceability. It has been found that for motors capable of generating high accelerations of up to 400 m/s$^2$, in which the required forces are relatively large, this may result in a ripple of up to 8%, which is undesirable.

SUMMARY

It is desirable to improve the design freedom of an electromagnetic motor as applied for positioning objects.

It is further desirable to provide a multiphase motor having a reduced ripple in the motor constant as a function of position of the magnets relative to the coils.

According to an embodiment of the invention, there is provided a multiphase motor comprising:
  a coil system;
  a magnet system moveable parallel and relative to the coil system in a first main driving direction;
  wherein the coil system is configured to generate magnetic fields interacting with the magnet system to cause driving forces in the first main driving direction to move the magnet system relative to the coil system,
wherein the coil system comprises a plurality of coil assemblies, wherein each coil assembly has a first dimension in the first main driving direction, and wherein a non-zero first gap is present between adjacent coil assemblies seen in the first main driving direction,
wherein the magnet system comprises a magnet assembly with an array of magnets, wherein adjacent magnets in the magnet assembly have opposite polarity,
and wherein the magnet assembly has a first dimension in the first main driving direction substantially equal to J times the first dimension of each coil assembly plus J/2 times the first gap with J being a positive integer.

According to another embodiment of the invention, there is provided a lithographic apparatus comprising a multiphase motor according to the invention.

According to a further embodiment of the invention, there is provided a device manufacturing method wherein use is made of a multiphase motor according to the invention.

According to a yet further embodiment of the invention, there is provided an electromagnetic motor comprising:
  a magnet assembly configured to generate an alternating magnetic field having a magnetic pitch in a first direction;
  a coil assembly comprising a plurality of coils that are configured to co-operate with the magnet assembly to generate a first force in the first direction, the plurality of coils being arranged in a first set of coils and a second set of coils; and wherein a first coil pitch of the first set of coils in the first direction is different from a second coil pitch of the second set of coils in the first direction.

According to another aspect of the present invention, there is provided an electromagnetic motor comprising:

a magnet assembly configured to generate a two-dimensional alternating magnetic field having a first magnetic pitch in a first direction and a second magnetic pitch in a second direction;

a coil assembly configured to co-operate with the magnet assembly to generate a first force in the first direction and a second force in the second direction, wherein the coil assembly comprises a first coil set comprising a plurality of first coils for generating the first force and a second coil set comprising a plurality of second coils for generating the second force, wherein a ratio R1 of a first coil pitch in the first coil set in the first direction over the first magnetic pitch is different from a ratio R2 of a second coil pitch in the second coil set in the second direction over the second magnetic pitch.

According to yet another aspect of the present invention, there is provided a stage apparatus configured to position an object, the stage apparatus comprising:

an object table configured to hold the object and;

one or more electromagnetic motors according to the present invention, the one or more electromagnetic motors being configured to displace the object table.

According to yet another aspect of the present invention, there is provided a lithographic apparatus comprising an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the apparatus further comprises a stage apparatus according to the present invention or positioning the support or the substrate table.

According to yet another aspect of the present invention, there is provided a device manufacturing method comprising transferring a pattern from a patterning device onto a substrate, wherein the transferring the pattern comprises positioning the pattering device or the substrate using a stage apparatus according to the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a top view of a planar motor as known in the art;

FIG. 6 depicts a top view of an electromagnetic motor according to an embodiment of the present invention, FIGS. 7(*a*)-7(*c*) depict cross-sectional views of coil assemblies as can be applied in an electromagnetic motor according to the present invention;

FIG. 8 depicts a cross-sectional view of an electromagnetic motor according to another embodiment of the present invention.

DETAILED DESCRIPTION

Figure 1:
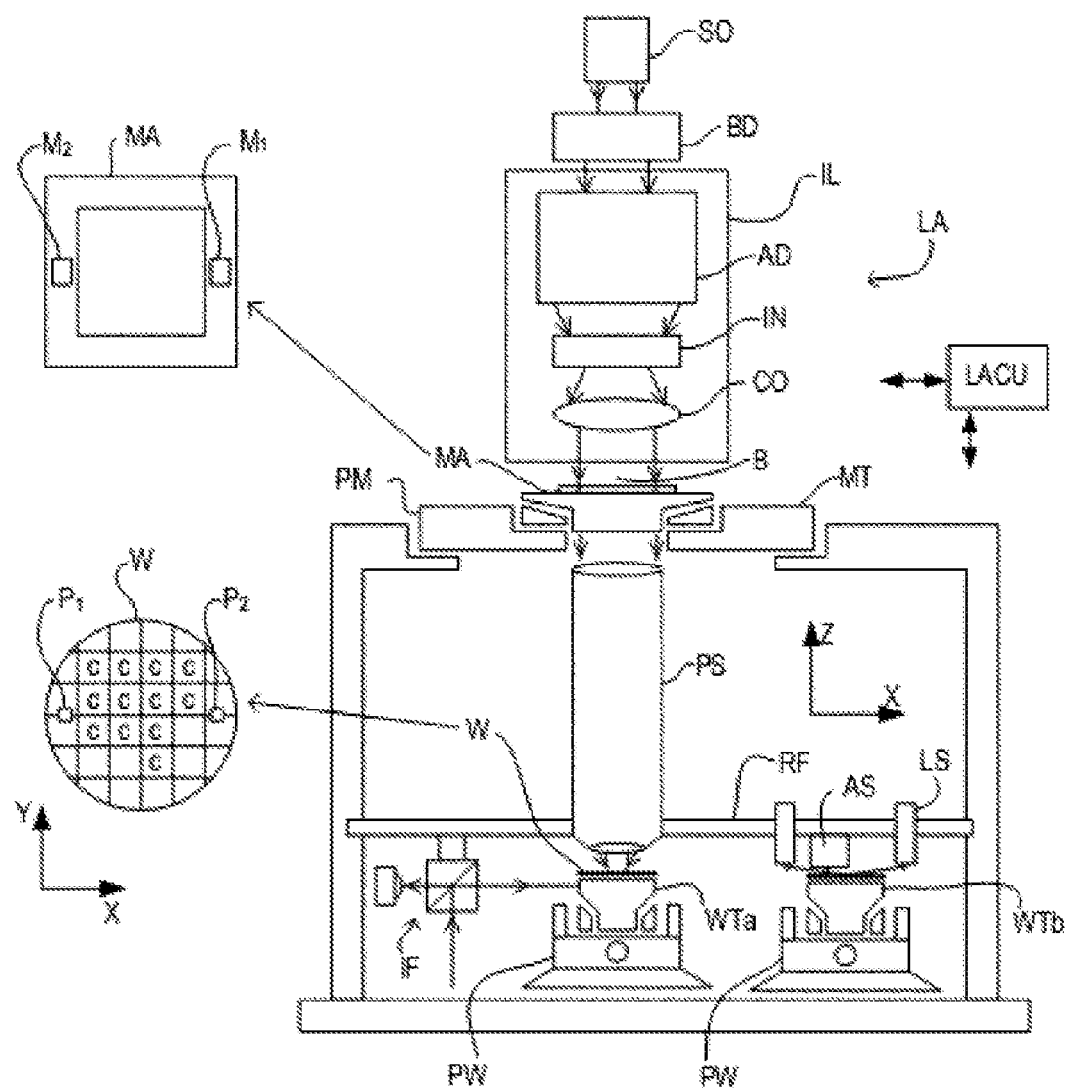
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system PS and the substrate W. An immersion liquid may also be applied to other spaces in the lithographic apparatus, for example, between the mask MA and the projection system PS. Immersion techniques can be used to increase the numerical aperture of projection systems. The term "immersion" as used herein does not mean that a structure, such as a substrate, must be submerged in liquid, but rather only means that a liquid is located between the projection system PS and the substrate W during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
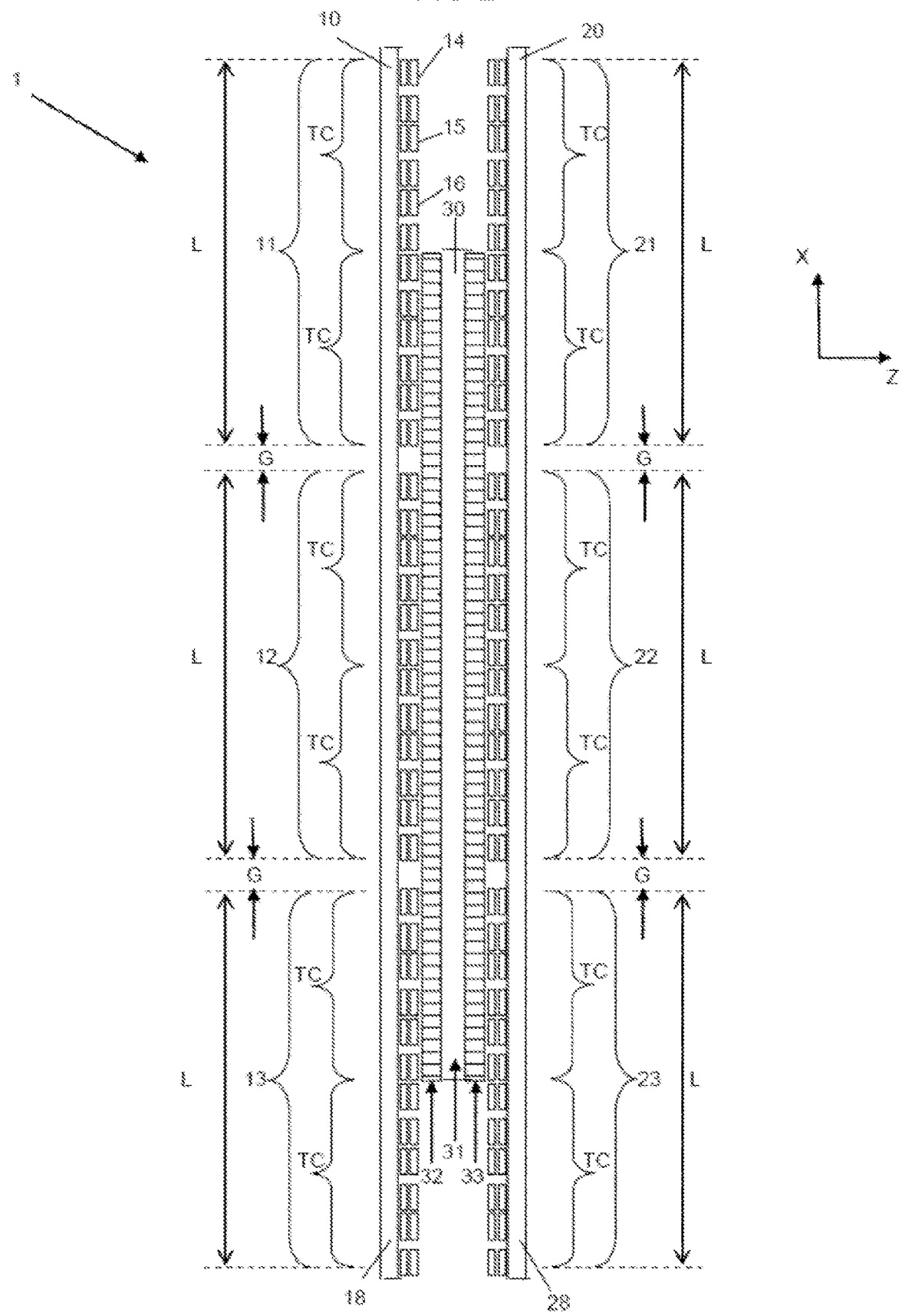
FIG. 2 depicts a multiphase linear motor according to an embodiment of the invention.

FIG. 2 depicts a three-phase linear motor 1 according to an embodiment of the invention. In this embodiment, the three-phase linear motor is part of the long-stroke module of the first positioner PM, but it will be apparent that such motors can additionally or alternatively be used in other parts of the lithographic apparatus to move and position objects, e.g. the substrate table constructed to hold a substrate.

The motor 1 comprises a first coil system 10 and a second coil system 20 arranged opposite to the first coil system 10. When "the coil systems" is used throughout the description, reference is made to both the first coil system 10 and the second coil system 20.

A magnet system 30 is arranged in between the coil systems 10, 20. The magnet system is moveable parallel and relative to the coil systems 10, 20 in a first main driving direction parallel to the X-direction. The motor 1 generates driving forces in the first main driving direction by generating magnetic fields in the coil systems 10, 20 that interact with the magnet system. By asymmetrically applying currents to the coil systems 10, 20, the magnet system may also generate forces in a non-driving direction parallel to the Z-direction, which can be used to prevent the magnet system from colliding with one of the coil systems 10, 20 and/or to levitate an object attached to the magnet system.

The coil systems 10, 20 comprise a plurality of coil assemblies 11, 12, 13, 21, 22, 23. The coil assemblies 11, 12, 13 correspond to the first coil system 10 and the coil assemblies 21, 22, 23 correspond to the second coil system 20. Each coil assembly has a dimension L in the first main driving direction, i.e. the X direction, and adjacent coil assemblies have a non-zero first gap G in between seen in the first main driving direction.

Each coil assembly 11, 12, 13, 21, 22, 23 comprises in this embodiment two three-phase coils TC, each three-phase coil providing three phases 14, 15, 16 as indicated for the upper three-phase coil TC of coil assembly 11 only.

The coil systems 10, 20 further comprise back iron 18, 28, respectively, which back iron fulfils the function of containing the magnetic fields generated in the coil system and thus to minimize the leakage of magnetic flux, and to function as support element for the coil assemblies.

The magnet system 30 comprises in this embodiment a magnet assembly 31 with an array of magnets, wherein adjacent magnets in the magnet assembly have opposite polarity perpendicular to the coil assemblies, i.e. parallel to the non-driving direction (Z-direction).

The magnets may be formed by one or more sub-magnets all having the same polarity. In this embodiment, the magnets have a dimension such that four magnets face a three-phase coil TC. Alternatively, intermediate magnets may be positioned between the magnets having an opposite polarity, the intermediate magnets e.g. having a polarity parallel to the driving direction, so as to form a Hallbach magnet array.

Further, in this embodiment, a first row 32 of sub-magnets facing the first coil system 10 and a second row of sub-magnets facing the second coil system 20 together form the magnets interacting with both the first and second coil systems, but any other configuration can also be envisaged.

Figure 3:
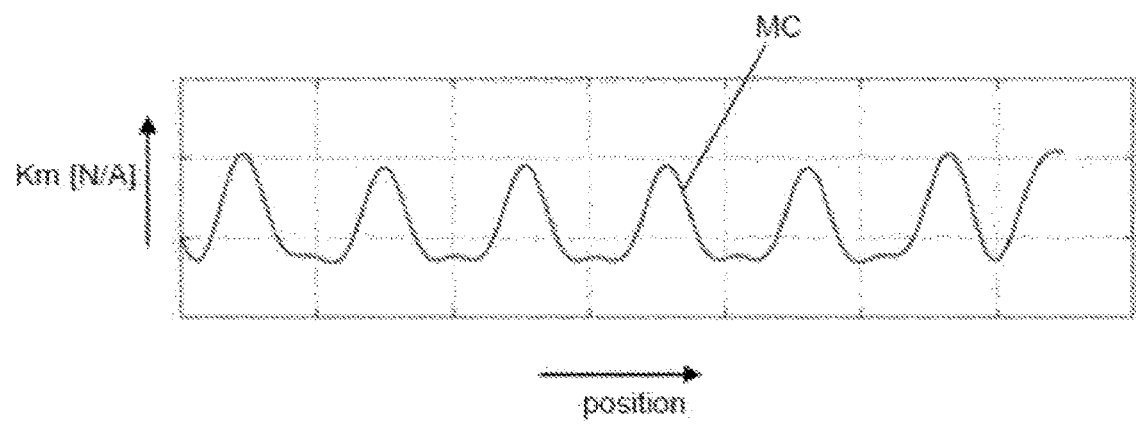
FIG. 3 depicts a graph indicating a motor constant as a function of position for a multiphase linear motor similar to the motor of FIG. 2, but with a prior art configuration.

Preferably, the gap G between adjacent coil assemblies is zero or close to zero meaning that it is close to a distance between coils in a coil assembly as a non-zero gap G disturbs the periodicity of the position of the three-phase coils TC with respect to the magnets. This causes a non-constant generated force as function of position. An example thereof is shown in FIG. 3, depicting a graph MC for a motor constant Km in Newton/Amperes for the first main driving direction as function of position of the magnet system in the first main driving direction when the magnet system has a first dimension in the first main driving direction equal to J times the first dimension L of each col assembly, with J being a positive integer as used in the prior art. The ripple can easily be ±8%.

A non-zero gap G may be caused by the fact that due to manufacturability and serviceability coil assemblies can only comprise a limited number of three-phase coils TC, in this embodiment two coils TC. When the coil assemblies are mounted together to form a coil system, high voltage design rules, e.g. for creepage and clearance, and mechanical design rules may determine that a non-zero gap G needs to be present between adjacent coil assemblies, thereby introducing the ripple.

Compared to the prior art configuration, the invention is able to reduce the introduced ripple by extending the magnet assembly. In the embodiment of FIG. 2, the magnet assembly 31 has been given a first dimension in the first main driving direction substantially equal to J times the first dimension L of each coil assembly plus J/2 times the first gap G with J being a positive integer.

The extension in this embodiment may be a single magnet that compensates the ripple at least partially. However, depending on the size of the magnets and the size of the gap G, the extension may also be formed by two or more magnets.

Figure 4:
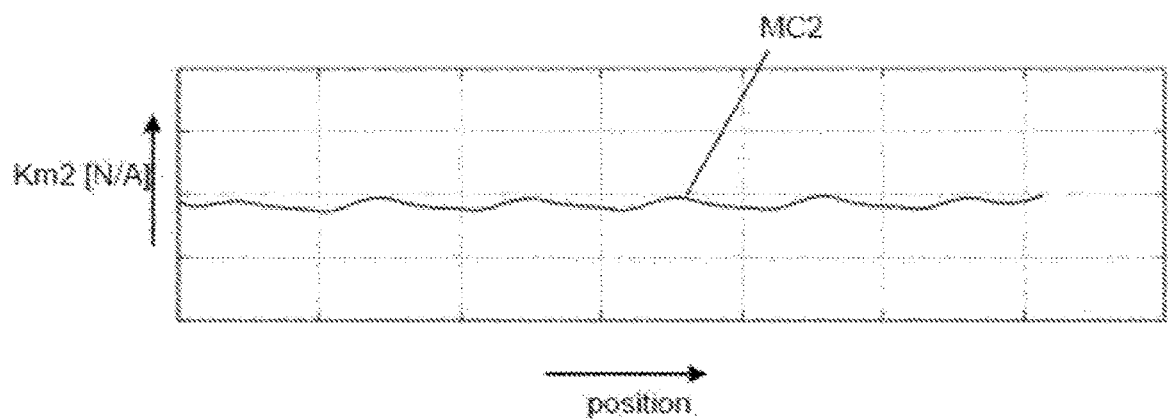
FIG. 4 depicts a graph indicating a motor constant as a function of position for the multiphase linear motor of FIG. 2.

An example of the effect of the extension is shown in FIG. 4 which depicts a graph MC2 for a motor constant Km2 in Newton/Amperes for the first main driving direction as function of position of the magnet system 30 in the main driving direction. The scale of the graph is identical to the scale of the graph of FIG. 3, so that it is clear that the extension of the magnet system results in a significant reduction of the ripple of the motor constant. The ripple can easily be reduced to below ±0.5%.

Although the embodiment of FIG. 2 depicts a coil system having three coil assemblies, it will be clear that the coil system can have any number of coil assemblies.

Although the embodiment of FIG. 2 depicts the motor having a first and second coil system with the magnet system in between, a motor comprising only one of the two coil systems with the magnet system arranged parallel next to the coil system also falls within the scope of the invention.

Although the described embodiment is a three-phase system, the invention can be applied to any multiphase linear motor, including but not limited to a two-phase motor and four-phase motor.

Although the described embodiment has been described as solving/reducing the problem of ripple of the motor constant in the main driving direction as function of the position in the driving direction, the invention can alternatively or additionally be applied to solve/reduce the problem of ripple of the motor constant in the non-driving direction as function of the position in the driving direction.

Although the motor described in FIG. 2 may suggest that the invention can only be applied to a linear motor, the invention can also be applied to a planar motor in which the coil system and the magnet system also extend in a second main driving direction perpendicular to both the X- and Z-direction and which may alternatively be referred to as the Y-direction.

The coil assembly will have a second dimension in the second main driving direction, wherein a non-zero second gap is present between adjacent coil assemblies in the second main driving direction, and wherein the magnet assembly has a second dimension in the second main driving direction substantially equal to K times the second dimension of each coil assembly plus K/2 times the second gap with K being a positive integer, which is similar for the dimensions in the first main driving direction.

According to another aspect of the present invention, an electromagnetic motor is described that may be applied in a lithographic apparatus. In particular, in the lithographic apparatus according to the present invention, either the first or second positioning devices PW, PM or both may comprise one or more electromagnetic motors according to the present invention for positioning the patterning device or the substrate.

In an embodiment, the long-stroke module of the second positioning device PW comprises a planar motor according to the present invention. Typically, a substrate as applied in a lithographical apparatus according to the present invention, needs to be displaced in a horizontal plane, further on referred to as the XY-plane, over comparatively large distances, e.g. 500 mm or more in both the X-direction and the Y-direction.

In FIG. 5, a top view of a planar motor as known in the art is schematically shown. The planar motor 200 comprises a magnet assembly 210 comprising a plurality of permanent magnets 210.1 configured to generate a spatially alternating magnetic field in two directions; X-direction and Y-direction. The magnets as indicated by the grey squares have an opposite magnetic polarization compared to the magnets indicated by the white squares. The alternating magnet field has a magnetic pitch Pm in the X-direction and in the Y-direction. The planar motor 200 further comprises a coil assembly 220 configured to generate forces in both the X-direction and the Y-direction, by providing an appropriate current to the coils or coil sets 220.1, 220.2, 220.3 and 220.4 of the coil assembly 220. In the embodiment as shown, each coil set comprises a triplet of coils, the coils having a coil pitch Pc in both the X-direction and the Y-direction. In the embodiment as shown, the coil pitch Pc as applied in the coils of the four coil set equals:

$$Pc = \frac{4}{3} Pm \qquad (1)$$

In accordance with the present invention, coil pitch or coil span may be referred to as the distance between two coil sides or the width of a coil as applied in an electromagnetic motor along the direction of the alternating magnetic field. As shown by equation (1), it may be expressed as a function of the magnetic pitch Pm, i.e. the width of a magnetic pole of the magnetic field distribution. In the embodiment as shown, coil sets 220. and 220.3 are configured to generate a force in the first direction (X-direction), whereas the coil sets 220.2 and 220.4 are configured to generate a force in the second direction (Y-direction). As can be seen, the coil sets as applied to generate forces in the first direction (X-direction) are substantially equal in size to the coil sets as applied to generate force in the second direction (Y-direction). Such an arrangement may be suited in case the force requirements of the motor in both directions are substantially equal.

In general, however, the force requirements may be different. In addition, there may be geometrical constraints limiting the options to optimize a usage of the area available for the application of coils or coil sets. As such, merely shortening or elongating the coils exerting forces in first direction compared to the coils exerting forces in the second direction may not be a suitable or realistic option. As such, the present invention introduces another degree of freedom that enables to realize an improved usage of the available footprint of a coil assembly of a planar motor or a linear motor. Within the meaning of present invention, 'footprint' is used to denote the available area onto which coils for a coil assembly can be positioned.

FIG. 6 schematically depicts a first embodiment of an electromagnetic motor according to the present invention. The electromagnetic motor 400 according to the first embodiment of the present invention is a planar motor comprising a magnet assembly 410 and a coil assembly 420 configured to co-operate with the magnet assembly 410, thereby generating forces in both a first direction (X-direction) and a second direction (Y-direction). In the embodiment as shown, the magnet assembly comprises a plurality of permanent magnets configured to generate an alternating magnetic field with a magnetic pitch Pm1 in the first direction and a magnetic pitch Pm2 in the second direction. It can be pointed out that, in order to increase the magnetic strength of the spatially alternating magnetic field, use may e.g. be made of a Halbach configuration of magnets. In such configuration, use may e.g. be made of permanent magnets having a magnetic polarization with a component parallel to the XY-plane. In the embodiment as shown, the first magnetic pitch Pm1 is equal to the second magnetic pitch Pm2. It should however be noted that this is not essential, i.e. the first magnetic pitch Pm1 may also be different from the second magnetic pitch Pm2. In order to generate a force in the Y-direction, the coil assembly 420 of the electromagnetic motor according to the present invention comprises a first coil set comprising four triplets of coils 420.1, 420.2, 420.3 and 420.4, the coils of the first coil set having a coil pitch Pc1. In order to generate a force in the X-direction, the coil assembly 420 of the electromagnetic motor according to the present invention comprises a second coil set comprising two triplets of coils 420.5 and 420.6 having a coil pitch Pc2. It can be pointed out that, in general, an electromagnetic motor according to the present invention may also be controlled in such manner that a force is generated in a direction perpendicular to the direction or directions of the alternating magnetic field. As such, by appropriate control of the currents supplied to the coil assembly 420, a force in the Z-direction, perpendicular to the XY-plane may be generated as well. In accordance with the embodiment of the present invention, and in contrast with the planar motor as shown in FIG. 2, a ratio R1 of the coil pitch Pc1 over the magnetic pitch Pm1 is different from a ratio R2 of the coil pitch Pc2 over the magnetic pitch Pm2:

$$R_1 = \frac{Pc1}{Pm1} \neq R_2 = \frac{Pc2}{Pm2} \quad (2)$$

In case Pm1=Pm2, the coil pitch Pc1 would thus be different from the coil pitch Pc2. By doing so, the electromagnetic motor according to the present invention applies an additional degree of freedom which enables to make better use of the available footprint for the coil assembly 420. In the embodiment as shown, the coil pitch Pc1 as applied in the first coil set, e.g. in the first triplet of coils 420.1, and the coil pitch Pc2 as applied in the second coil set, e.g. in coil set 420.5 or 420.6, are given by:

$$Pc1 = \frac{4}{3} Pm1 \quad (3)$$
$$Pc2 = \frac{5}{3} Pm2$$

The coils of the second coil set are thus wider, i.e. have a larger coil pitch than the coils in the first coil set, with respect to their respective magnetic pitch. The application of a larger coil pitch enables to generate the same force with a smaller current density (under the assumption of applying substantially the same coil height), resulting in a reduced power dissipation. Alternatively, in case the same current density would be applied, a larger force could be obtained. By selecting different ratios R1 and R2, one may fill, in an optimal manner, the available footprint with coils, thereby meeting the force requirements in both directions.

In case the available footprint is substantially covered by the coil assembly, a more favorable thermal behavior of the motor may be obtained as well. By allowing the selection of different ratios R1 and R2, the lengths of the applied coils in the first and second direction may be tuned such that the dissipation is more evenly spread over the entire footprint. Due to differences in force requirements and duty cycles between the first and second direction, the dissipation in both coil sets could be substantially different. Selecting different ratios R1 and R2 however provides in additional freedom for the dimensioning of the coils of the first and second coil sets such that the dissipation in both coil sets may become more balanced. In particular, one may obtain, in an embodiment, a substantially even distribution of the average power dissipation over the footprint. This may result in a more even temperature distribution over the coil assembly.

In a preferred embodiment, the coil sets as applied in the electromagnetic motor are arranged in triplets, whereby the triplets are configured to be powered by a three-phase power supply. In this respect, it should be pointed out that the requirement to supply power to a coil set using a three-phase power supply limits the available choices of the ratio of the coil pitch over the magnetic pitch.

Figure 7A:
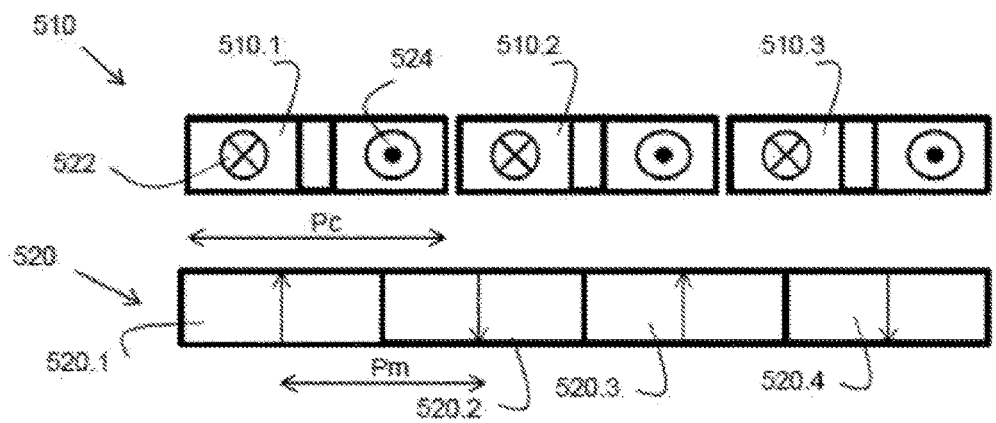
Figure 7B:
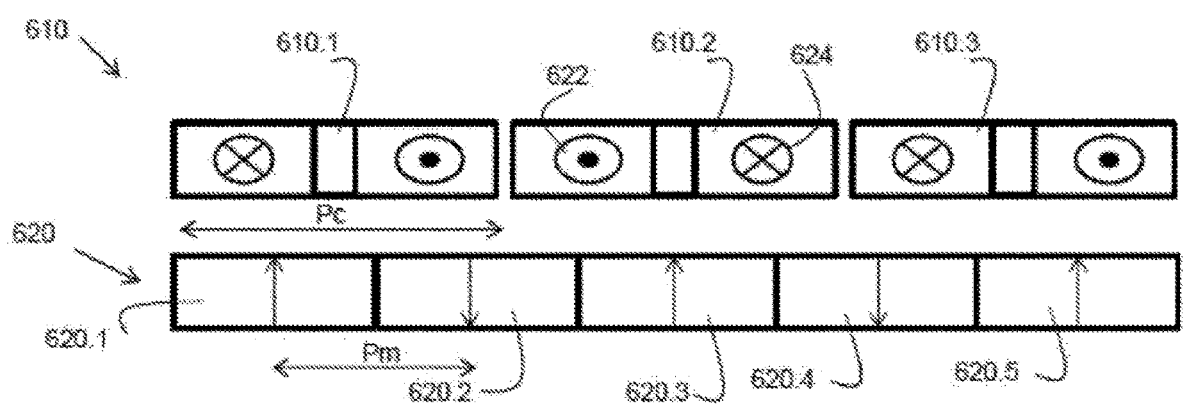
Figure 7C:
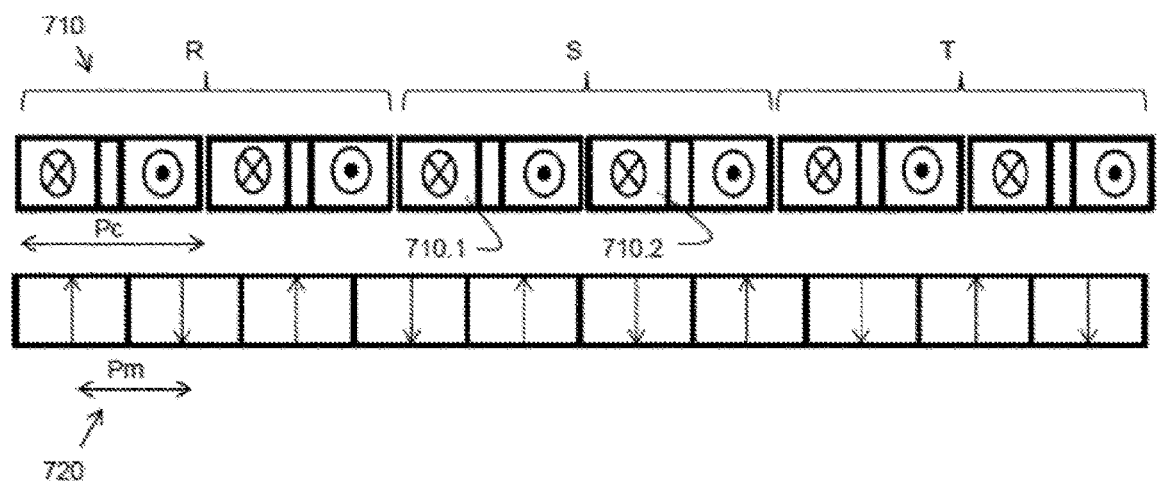

FIG. 7 (*a*) schematically shows a cross-sectional view of part of a magnet assembly 520 as can be applied in an electromagnetic motor according to the present invention, the part of the magnet assembly comprises 4 permanent magnets 520.1, 520.2, 520.3 and 520.4 that are alternatingly polarized (indicated by the arrows in the magnets) and having a magnetic pitch Pm. FIG. 7 (*a*) further schematically shows a coil set 510 comprising three coils 510.1, 510.2 and 510.3 having a coil pitch Pc according to equation (1), i.e. Pc equals 4/3×Pm, the magnetic pitch of the magnet assembly 520. As such, the depicted arrangement is similar to the layout of the coil sets 420.1, 420.2, 420.3 or 420.4 relative to the magnet assembly 410 in FIG. 6. In FIG. 7 (*a*), the symbols 522 and 524 indicate the direction of the current through the coils. In the illustrated case, i.e. whereby Pc equals 4/3×Pm, the magnetic pitch, the three coils 510.1, 510.2 and 510.3 of the coil assembly 510 may be connected to an R- S- and T-phase of a three phase power supply. By doing, a substantially constant force between the magnet assembly 520 and the coil assembly 510 may be generated during use.

FIG. 7 (*b*) schematically shows a cross-sectional view of part of a magnet assembly 620 as can be applied in an electromagnetic motor according to the present invention, the part of the magnet assembly comprises 5 permanent magnets 620.1, 620.2, 620.3, 620.4 and 620.5 that are alternatingly polarized (indicated by the arrows in the magnets) and having a magnetic pitch Pm. FIG. 7 (*b*) further schematically shows a coil set 610 comprising three coils 610.1, 610.2 and 610.3 having a coil pitch Pc equal to 5/3 times the magnetic pitch Pm of the magnet assembly 620. As such, the depicted arrangement is similar to the layout of the coil sets 420.5 or 420.6 relative to the magnet assembly 410 in FIG. 6. In such an arrangement, the three coils of the coil set 610 may still be supplied by a three-phase power supply, provided that the direction of the current through the second coil 610.2 is reversed, as indicated by the symbols 622, 624. This may e.g. be realized by reversing the winding direction of the second coil 610.2 or by rotating the coil 180 degrees about an axis perpendicular to the plane of the drawing.

Yet another manner of applying a different coil pitch that is suitable for supply by means of a three-phase power supply is schematically illustrated in FIG. 7 (*c*). FIG. 7 (*c*) schematically shows part of a magnet assembly 720 comprising 10 alternatingly polarized magnets configured to cooperate with a coil assembly 710 comprising 6 coils, each coil having a coil pitch Pc equal to 5/3×Pm, the magnetic pitch of the magnets of the magnet assembly 720. In the arrangement as shown, the coils are grouped in pairs of two adjacent coils, each pair of two adjacent coils, e.g. coils 710.1 and 710.2, being supplied by the same phase (R, S or T-phase as indicated) of the three-phase power supply. Such pair of coils has a pitch Pw, referred to as the winding pitch, equal to:

$$Pw = 2 \cdot Pc = \frac{10}{3} Pm \qquad (4)$$

By doing so, there is no need to reverse the direction of the current through the coils that are supplied by the second phase, i.e. the S-phase as indicated.

With respect to the embodiment as shown in FIG. 7 (c), it may be worth noting that the pairs of coils belonging to the same phase need not be supplied by the same power supply. As such, the coil assembly 710 as shown may e.g. be supplied, in an embodiment, by a two three-phase power supplies, one three-phase power supply e.g. powering the left-most coil of each of the indicated R, S and T phases, another three-phase power supply e.g. powering the right-most coil of each of the indicated R, S and T phases. In such an arrangement, a different current, either different in amplitude or in phase angle, may be applied in the coils belonging to the same phase, such as the coils 710.1 and 710.2.

FIGS. 6 and 7 (a)-(c) illustrate the application of different coil pitches for different coil sets as can e.g. be applied in an electromagnetic motor according to the first embodiment of the present invention. In this first embodiment, different coil pitches, or different ratios of coil pitches over magnetic pitches are applied in different driving directions of the electromagnetic motor.

It is worth pointing out however that, in addition to applying different coil pitches in the different driving directions, it may also be advantageous to apply, in case multiple coil sets per driving direction are used, different coil pitches in these multiple coil sets as well, thereby further increasing the flexibility to fill up the available footprint. As an example, referring to FIG. 3, the four triplets of coils 420.1, 420.2, 420.3 and 420.4 as used for generating a force in the Y-direction, need not have the same coil pitch Pc1. Rather, the triplets of coils 420.1, 420.2, 420.3 and 420.4 may e.g. be grouped in coil sets having a different coil pitch. As an example, the triplets of coils 420.1 and 420.4 could be considered one coil set, whereby a pitch Pc1 is applied for this coil set, while the triplets of coils 420.2 and 420.3 could be considered another coil set, whereby a third coil pitch, different from Pc1 is applied. In an embodiment, the third coil pitch may e.g. be selected equal to Pc2. The third coil pitch may however be different from Pc2 as well.

Combining coil sets having different coil pitches may also be advantageous in a linear motor. Therefore, in a second embodiment, the present invention provides in an electromagnetic motor having a magnet assembly that is configured to generate an alternating magnetic field having a pitch Pm in a first direction and a coil assembly configured to co-operate with the magnet assembly to generate a first force in the first direction and comprising a plurality of coils, whereby the plurality of coils are arranged in a first set of coils and a second set of coils, a coil pitch Pc1 of the first set of coils being different from a coil pitch Pc2 of the second coil set. FIG. 8 schematically shows a cross-sectional view of such a motor. FIG. 8 schematically shows part of a magnet assembly 820 of an electromagnetic motor according to the present invention, the magnet assembly 820 comprising a plurality of alternatingly polarized permanent magnets such as magnets 820.1 and 820.2, (the polarization direction being indicated by the arrows in the magnets). The electromagnetic motor further comprises a coil assembly 810 comprising a first coil set 812 and a second coil set 814. In the embodiment as shown, the first coil set comprises three coils, each coil having a coil pitch Pc1, the second coil set also comprises three coils, each coil having a coil pitch Pc2. During use, the coil assembly 810 may be configured to co-operate with the magnet assembly 820 to generate a force, e.g. along the Y-direction, i.e. the same direction along which the alternating magnetic field is generated by the magnet assembly 820. In general, the first coil set 812 may e.g. comprise one or more coil triplets, referred to as the first coil triples, and the second coil set 814 may e.g. also comprise one or more coil triplets, referred to as the second coil triples. In the embodiment as shown, the coil pitches Pc1 and Pc2 of the respective first coil set 812 and second coil set 814 satisfy the conditions of equation (3). As each coil set has one coil triplet, the coil assembly 810 as shown spans 9 magnets, i.e. 9 times the magnetic pitch Pm, i.e. the distance between adjacent North and South poles of the alternating magnetic field. It can further be pointed out that the middle coil of the second coil set 814 has a reversed winding direction, similar to the coil set 610 of FIG. 7 (b). In such embodiment, the coil triplets of the first coil set and the coil triplets of the second coil set may be configured to be powered by a common three-phase power supply, whereby coils of the first coil triplets and of the second coil triplets that are configured to be powered by the same phase of the three-phase power supply can be connected in series. In the embodiment as shown, coils 812.1 and 814.1 may be connected in series, coils 812.2 and 814.2 may be connected in series and coils 812.3 and 814.3 may be connected in series. In such embodiment, it may be preferred to apply the same conductor dimensions in the first coil set and in the second coil set. In particular, a cross-section of a winding of a coil of the first coil set may be selected substantially equal to a cross-section of a winding of a coil of the second coil set. By doing so, the current density may be kept substantially equal in both coil sets, when the coils of the coil triplets are connected in series as mentioned above. As such, a substantially uniform dissipation may be obtained in the coil assembly. In an embodiment, a height H of a winding of a coil of the first coil set is selected substantially equal to a height of a winding of a coil of the second coil set. By doing so, a back surface of the coil assembly, i.e. a surface formed by the coil surfaces not facing the magnets (indicated by the dotted line 850) may be substantially flat, enabling the application of a common cooling arrangement for both coil sets.

With respect to the embodiment as shown in FIG. 8, it can be pointed out that by combining coil sets having a different coil pitch, an increased flexibility or design freedom is obtained. As indicated, the overall width of the coil assembly as shown spans 9 magnets. Such a width could not be obtained when combining coil sets having the same coil pitch. The electromagnetic motor according to the invention which applies coil sets with different coil pitches to generate a force thus has a higher design freedom with respect to the overall width of the coil assembly, for a given magnetic pitch. In an embodiment, this increased design freedom may be realized by selecting Pc2 as Pc1<Pc2<2×Pc1.

The electromagnetic motor according to the present invention may advantageously be implemented in a stage apparatus according to the present invention. In an embodiment, the present invention provides in a stage apparatus configured to position an object, e.g. a patterning device or a substrate as applied in a lithographic apparatus. Such a stage apparatus comprises an object table for holding the object to be positioned and one or more electromagnetic motors according to the present invention for displacing the object table.

In an embodiment of the stage apparatus according to the present invention, the coil assembly of the electromagnetic motor as applied is mounted to the object table. Alternatively, the magnet assembly of the electromagnetic motor as applied may be mounted to the object table.

In an embodiment, the stage apparatus may further comprise a control unit such as a microcontroller, microprocessor, computer or the like for controlling the power as supplied to the electromagnetic motor, in particular the current as supplied to the coil assembly of the electromagnetic motor. In such embodiment, the control unit may be configured to receive a position set point (i.e. representative of a desired position of the object table) as an input signal, e.g. at an input terminal of the control unit, and generate appropriate control signals, e.g. outputted at an output terminal of the control unit, for controlling the current through the coils of the coil assembly. In such an embodiment, the stage apparatus may advantageously be provided with a position measurement system as well, such position measurement system e.g. providing a position signal, representative of the position of the object table relative to a reference frame, to the input terminal of the control unit. Examples of such position measurement systems may e.g. include interferometer based measurement systems or encoder based measurement systems.

In an embodiment, the magnet assembly of the electromagnetic motor according to the present invention is mounted to a magnetic member, e.g. a ferromagnetic member, in order to increase the magnetic field strength.

It is noted that the term "consecutive" or "consecutively" in this context means that no other exposures or irradiation of target portions takes place in between the respective steps. However, it does not exclude other operations to be performed in between the respective steps, such as measurement steps, calibration steps, positioning steps, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An electromagnetic motor comprising:
a magnet assembly configured to generate a two-dimensional alternating magnetic field having a first magnetic pitch in a first direction and a second magnetic pitch in a second direction; and
a coil assembly configured to co-operate with the magnet assembly to generate a first force in the first direction and a second force in the second direction, wherein the coil assembly comprises a plurality of first coil sets, each first coil set comprising a plurality of first coils for generating the first force and a plurality of second coil sets, each second coil set comprising a plurality of second coils for generating the second force, wherein at least one first coil set has a different coil pitch from another first coil set, and wherein a ratio R1 of a first coil pitch in the first coil set in the first direction over the first magnetic pitch is different from a ratio R2 of a second coil pitch in the second coil set in the second direction over the second magnetic pitch.

2. The electromagnetic motor according to claim 1, wherein:

$$Pm1 = Pm2 = Pm,$$

whereby:
Pm1=the first magnetic pitch;
Pm2=the second magnetic pitch; and
Pm=a magnetic pitch.

3. The electromagnetic motor according to claim 2, wherein:

$$Pc1 = \frac{4}{3}Pm; \text{ and}$$

$$Pc2 = \frac{5}{3}Pm,$$

where Pc1 is the first coil pitch and Pc2 is the second coil pitch.

4. The electromagnetic motor according to claim 1, wherein the plurality of first coils of the first coil set are arranged in one or more first coil triplets configured to be powered by a first three-phase power supply.

5. The electromagnetic motor according to claim 4, wherein the plurality of second coils of the second coil set are arranged in one or more second coil triplets configured to be powered by a second three-phase power supply.

6. The electromagnetic motor according to claim 1, wherein the plurality of second coils of the second coil set are arranged in one or more second coil triplets configured to be powered by a second three-phase power supply.

7. A stage apparatus configured to position an object, the stage apparatus comprising:
an object table configured to hold the object; and
one or more electromagnetic motors according to claim 6, the one or more electromagnetic motors being configured to displace the object table.

8. The electromagnetic motor according to claim 1, wherein the magnet assembly comprises a plurality of permanent magnets.

9. The electromagnetic motor according to claim 8, wherein the plurality of permanent magnets have a Halbach configuration.

10. The electromagnetic motor according to claim 1, wherein the first magnetic pitch is different from the second magnetic pitch.

11. The electromagnetic motor according to claim 1, wherein:
the plurality of first coils comprises four triplets of coils, each of the coils of the first coil set having the first coil pitch; and
the plurality of second coils comprises two triplets of coils, each of the coils of the second coil set having the second coil pitch.

12. The electromagnetic motor according to claim 1, wherein the coil assembly is configured to co-operate with the magnet assembly to also generate a force in a third direction perpendicular to the first direction and the second direction.

13. A stage apparatus configured to position an object, the stage apparatus comprising:
an object table configured to hold the object; and
one or more electromagnetic motors according to claim 1, the one or more electromagnetic motors being configured to displace the object table.

14. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the lithographic apparatus further comprises a stage apparatus according to claim 13 for positioning the support or the substrate table.

15. A device manufacturing method comprising transferring a pattern from a patterning device onto a substrate, wherein the transferring the pattern comprises positioning the pattering device or the substrate using a stage apparatus according to claim 13.

16. A method of positioning an object, the method comprising:
fixing a magnet assembly to the object, the magnet assembly configured to generate a two-dimensional alternating magnetic field having a first magnetic pitch in a first direction and a second magnetic pitch in a second direction;
generating one or more of a first force in the first direction and a second force in the second direction by generating magnetic fields in a coil system comprising a plurality of coil assemblies, each coil assembly comprising a plurality of first coil sets, each first coil set comprising a plurality of first coils, the plurality of coils configured to generate the first force in the first direction and a plurality of second coil sets, each second coil set comprising a plurality of second coils configured to generate the second force in the second direction, wherein at least one first coil set has a different coil pitch from another first coil set, and wherein a ratio of a first coil pitch in the first coil set in the first direction over the first magnetic pitch is different from a ratio of a second coil pitch in the second coil set in the second direction over the second magnetic pitch; and
reducing ripple in a motor constant to be below ±0.5% based on a length of the magnet assembly, a length of each coil assembly, and a gap between adjacent coil assemblies.

17. The method according to claim 16, wherein the plurality of first coils of the first coil set are arranged in one or more first coil triplets configured to be powered by a first three-phase power supply.

18. The method according to claim 17, wherein the plurality of second coils of the second coil set are arranged in one or more second coil triplets configured to be powered by a second three-phase power supply.

19. An electromagnetic motor comprising:
a magnet assembly configured to generate a two-dimensional alternating magnetic field having a first magnetic pitch in a first direction and a second magnetic pitch in a second direction; and
a coil system comprising a plurality of coil assemblies, with each coil assembly comprising a plurality of coils that are configured to co-operate with the magnet assembly to generate a first force in the first direction and/or a second force in the second direction;
wherein the magnet assembly has a first dimension in the first direction substantially equal to J times a first dimension of each coil assembly plus J/2 times a first gap G1 with J being a positive integer and the first gap G1 corresponding to a separation between adjacent coil assemblies along the first direction, and a second dimension in the second direction substantially equal to K times a second dimension of each coil assembly plus K/2 times a second gap G2 with K being a positive integer and the second gap G2 corresponding to a separation between adjacent coil assemblies along the second direction.

20. The electromagnetic motor of claim 19, wherein a ratio of a first coil pitch in the first coil set in the first direction over the first magnetic pitch is different from a ratio of a second coil pitch in the second coil set in the second direction over the second magnetic pitch.

* * * * *